（12）United States Patent
DeNatale et al.

(10) Patent No.: US 9,409,768 B2
(45) Date of Patent: Aug. 9, 2016

(54) MEMS DEVICE WITH INTEGRATED TEMPERATURE STABILIZATION

(71) Applicant: Teledyne Scientific & Imaging, LLC, Thousand Oaks, CA (US)

(72) Inventors: Jeffrey F. DeNatale, Thousand Oaks, CA (US); Philip A. Stupar, Oxnard, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 98 days.

(21) Appl. No.: 14/065,310

(22) Filed: Oct. 28, 2013

(65) Prior Publication Data

US 2015/0115377 A1    Apr. 30, 2015

(51) Int. Cl.
 *B81B 7/00* (2006.01)
 *B81C 1/00* (2006.01)
 *G01C 19/5712* (2012.01)

(52) U.S. Cl.
 CPC ........... *B81B 7/0096* (2013.01); *B81C 1/00269* (2013.01); *G01C 19/5712* (2013.01); *B81B 7/0032* (2013.01); *B81B 7/0087* (2013.01); *B81B 2201/0242* (2013.01); *B81C 1/00301* (2013.01); *B81C 2203/0109* (2013.01)

(58) Field of Classification Search
 CPC .............................. B81B 7/0096; B81B 7/0087
 See application file for complete search history.

(56) References Cited

U.S. PATENT DOCUMENTS

| | | | | |
|---|---|---|---|---|
| 6,232,150 B1 * | 5/2001 | Lin | ..................... | B81C 1/00269 438/119 |
| 7,196,405 B1 * | 3/2007 | Ferreiro | ............... | H03H 9/1014 257/659 |
| 7,267,005 B1 * | 9/2007 | Kranz | ................ | G01C 19/5719 73/504.12 |
| 7,679,171 B2 * | 3/2010 | Anderson | ................ | F16F 1/18 257/698 |
| 2004/0055380 A1 * | 3/2004 | Shcheglov | ......... | G01C 19/5684 73/504.12 |
| 2004/0055381 A1 | 3/2004 | Shcheglov et al. | | |
| 2006/0196266 A1 * | 9/2006 | Holt | .................... | G01C 19/5719 73/504.02 |
| 2007/0290282 A1 * | 12/2007 | Belov | ...................... | H01F 7/066 257/421 |
| 2009/0002961 A1 * | 1/2009 | Camacho | .............. | H01L 23/047 361/760 |
| 2009/0085191 A1 * | 4/2009 | Najafi | ................... | B81B 7/0058 257/698 |
| 2010/0300201 A1 * | 12/2010 | Ge | ........................ | B81B 7/0048 73/504.12 |
| 2010/0315179 A1 * | 12/2010 | Schoepf | ............. | H03H 9/02448 333/186 |
| 2012/0280594 A1 * | 11/2012 | Chen | ...................... | H03H 3/007 310/313 R |
| 2013/0001765 A1 * | 1/2013 | Yaralioglu | ............ | H01L 23/345 257/704 |
| 2014/0361844 A1 * | 12/2014 | Quevy | ..................... | H03B 5/30 331/70 |

* cited by examiner

*Primary Examiner* — Michael Lebentritt
*Assistant Examiner* — Jordan Klein
(74) *Attorney, Agent, or Firm* — Snell & Wilmer LLP

(57) ABSTRACT

An apparatus for providing localized heating as well as protection for a vibrating MEMS device. A cap over a MEMS gyroscope includes an embedded temperature sensor and a heater. The temperature sensor is a trace made of a material with a known temperature/resistance coefficient, which loops back along itself to reduce electromagnetic interference. The heater is a resistive metal trace which also loops back along itself. The temperature sensor and the heater provide localized temperature stabilization for the MEMS gyroscope to reduce temperature drift in the MEMS gyroscope.

19 Claims, 9 Drawing Sheets

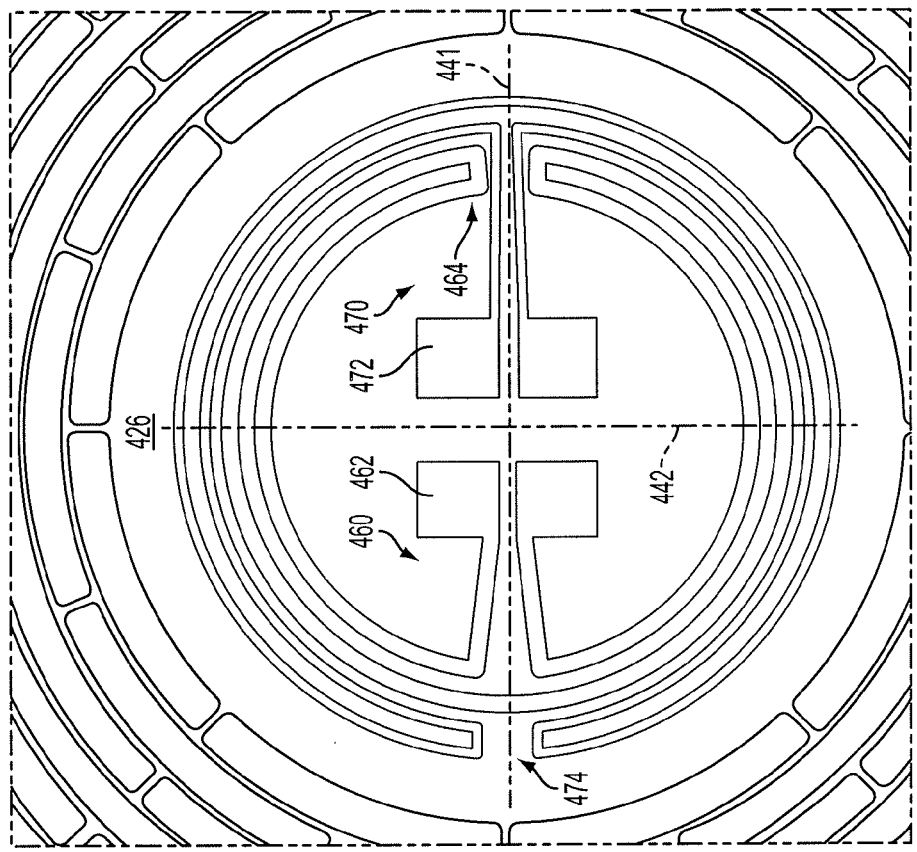
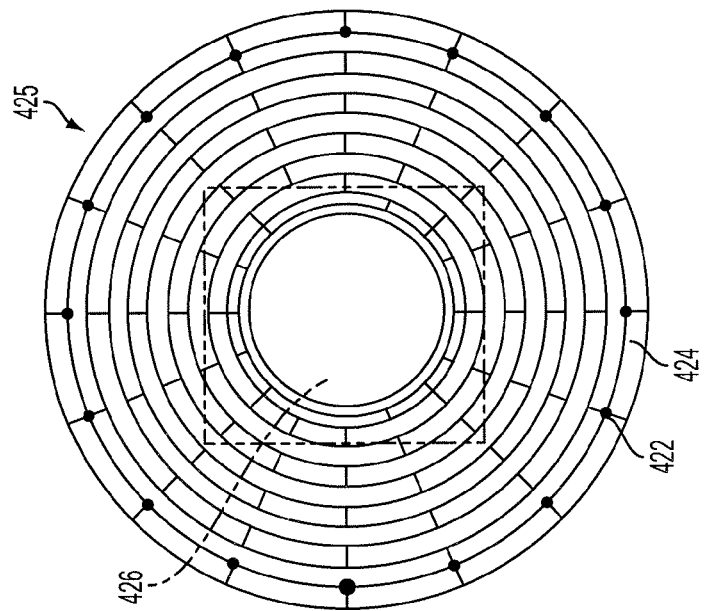
FIG. 4B
FIG. 4A

MEMS DEVICE WITH INTEGRATED TEMPERATURE STABILIZATION

STATEMENT REGARDING GOVERNMENT RIGHTS

This invention was made with Government support under Contract No. W31P4Q-10-1-0017 awarded by the Defense Advanced Research Projects Agency (DARPA). The Government has certain rights in this invention.

BACKGROUND

1. Field

The present disclosure relates to a microelectromechanical system (MEMS) device with integrated temperature sensor and heater.

2. Description of the Related Art

MEMS devices are small devices, generally ranging in size from 20 micrometers to 1 mm, and made of components between 1 to 100 micrometers in size. MEMS devices generally range from sensors, to actuators, to integrated systems. For example, U.S. Patent Application No. 2004/0055381 by Shcheglov et al., which is incorporated by reference in its entirety, describes a MEMS gyroscope comprising a disc-shaped planar mechanical resonator disposed within a case. The MEMS gyroscope can detect or determine the rotation rate of a moving platform.

MEMS devices are generally sensitive to temperature variations. For instance, high-performance MEMS gyroscopes are highly sensitive to local temperature. Temperature fluctuations introduce drift, which degrades overall performance. Nearby control electronics produce heat, which further introduces drift into the MEMS gyroscope. Many gyroscope systems are not temperature stabilized, which results in reduced accuracy. In order to better regulate temperature of the MEMS device against fluctuations in temperature, the entire system, including the MEMS device (i.e., a packaged sensor) and other electronics (i.e., a circuit board), are usually ovenized, or placed within a heating enclosure. However, ovenization is bulky, requires high power, imposes slow response times by causing higher lag time, and also fails to address local changes within the heating enclosure. The packaged MEMS device can be heated instead, but still imposes high power and slow response times.

SUMMARY

The present disclosure relates to a MEMS device cap having an embedded or integrated heater and temperature sensor. One aspect of the present disclosure is to provide precise temperature stabilization for a vibrating MEMS device. Another aspect of the present disclosure is to provide a cost-effective method of manufacturing a MEMS device with a cap.

In one implementation, a cap for a MEMS device comprises a body having an outer surface. The cap also includes a first pad located on the outer surface, a second pad located on the outer surface, a first trace embedded in the outer surface and connected to the first pad, and a second trace embedded in the outer surface and connected to the second pad.

In another implementation, a MEMS device package comprises a base layer, a MEMS device connected to the base layer, and a cap surrounding the MEMS device and connected to the base layer to encapsulate the MEMS device. The MEMS device package also includes a first trench in the cap, a second trench in the cap, a first pad on the cap, a second pad on the cap, a first trace located in the first trench and connected to the first pad, and a second trace located in the first trench and connected to the second pad.

In another implementation, a MEMS device package comprises a base layer, a MEMS device having a central stem portion connected to the base layer, and a cap surrounding the MEMS device and connected to the base layer to encapsulate the MEMS device. The MEMS device package also includes a first pad on the central stem portion, a second pad on the central stem portion, a first trace on the central stem portion and connected to the first pad, and a second trace on the central stem portion and connected to the second pad.

In yet another implementation, the present disclosure provides a method of fabricating a MEMS device package, the method comprising providing a base wafer, a device wafer, and a cap wafer, connecting the device wafer to the base wafer, processing the device wafer to form a MEMS device, forming trace circuitry on at least one of the cap wafer or the MEMS device, and positioning the cap wafer over the MEMS device, and connecting the cap wafer to the base wafer to form the MEMS device package.

BRIEF DESCRIPTION OF THE DRAWINGS

Other systems, methods, features, and advantages of the present disclosure will be or will become apparent to one with skill in the art upon examination of the following figures and detailed description. It is intended that all such additional systems, methods, features, and advantages be included within this description, be within the scope of the present disclosure, and be protected by the accompanying claims. Component parts shown in the drawings are not necessarily to scale, and may be exaggerated to better illustrate the important features of the present disclosure. In the drawings, like reference numerals designate like parts throughout the different views, wherein:

FIG. 4A is MEMS device according to an implementation of the present disclosure;

FIG. 4B is a magnified view of the MEMS device in FIG. 4A according to an implementation of the present disclosure;

DETAILED DESCRIPTION

Apparatus, systems and methods that implement the implementation of the various features of the present disclosure will now be described with reference to the drawings. The drawings and the associated descriptions are provided to illustrate some implementations of the present disclosure and not to limit the scope of the present disclosure. Throughout the drawings, reference numbers are re-used to indicate correspondence between reference elements. In addition, the first digit of each reference number generally indicates the figure in which the element first appears.

Throughout this disclosure, the term "processing" in the context of forming a wafer layer may include, but is not limited to, coating a layer with insulating or conductive material using a deposition process, patterning a layer using a masking or etching process, preparing the layer for bonding by depositing bond pads such as gold bond pads onto the surface of a layer, and/or removal of material from or complete removal of one or more layers of a wafer.

Vibrating MEMS devices, such as a MEMS gyroscope, can be encapsulated by a cap for protection against damage or scratching, or to encapsulate the MEMS device in a preferred environment, such as a vacuum. Because the MEMS gyroscope is suspended from or otherwise has space between it and a base portion, the cap further prevents unwanted exterior materials from entering. In certain applications, the cap encompasses a vacuum space or enclosure around the MEMS gyroscope. The present disclosure advantageously incorporates a heater and a temperature sensor in the cap, as will be described below.

Figure 1A:
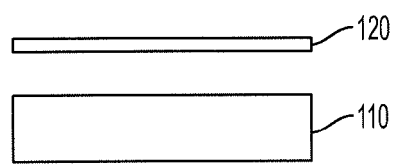
FIG. 1A is a diagram of a processing step according to an implementation of the present disclosure.

FIGS. 1A-1L show a fabrication process according to an implementation of the present disclosure. In particular, FIGS. 1A-1L show cross-sectional side views of the device being formed using the fabrication process. In FIG. 1A, a base wafer 110 and a device wafer 120 are provided. The base wafer 110 may be made of a suitable material, such as Si, at a sufficient thickness for a base for a MEMS device. The base wafer 110 may already be processed with contact pads or other electrical connections (not shown). The device wafer 120 is made of a suitable material, such as Silicon (Si), at a sufficient thickness for fabricating a MEMS device. For example, the device wafer 120 may be made of Si to fabricate a MEMS gyroscope.

Figure 1B:
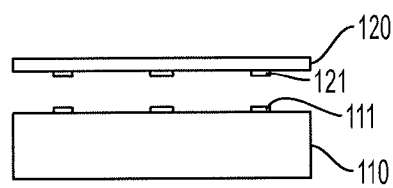
FIG. 1B is a diagram of a processing step according to an implementation of the present disclosure.

In FIG. 1B, base bonding pads 111 and device bonding pads 121 are formed on the base wafer 110 and the device wafer 120, respectively. The base bonding pads 111 and the device bonding pads 121 are formed from a suitable bonding material, such as a metal or a solder. The base bonding pads 111 and the device bonding pads 121 may be patterned on the base wafer 110 and the device wafer 120, respectively, using patterning methods such as masking and etching.

Figure 1C:
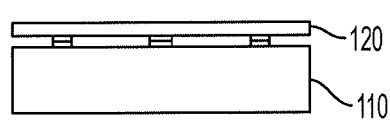
FIG. 1C is a diagram of a processing step according to an implementation of the present disclosure.
Figure 1D:
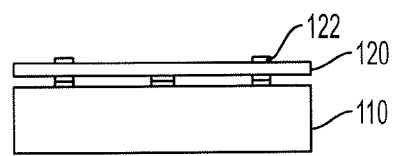
FIG. 1D is a diagram of a processing step according to an implementation of the present disclosure.

In FIG. 1C, the device wafer 120 is connected to the base wafer 110. The base bonding pads 111 connect to the device bonding pads 121. A thermo-compression bond or other suitable bonding method may be used to connect the device wafer 120 to the base wafer 110. In FIG. 1D, the cap bonding pads 122 are formed on the device wafer 120. The cap bonding pads 122 may be patterned using photoresistive masks and etching, or other patterning processes.

Figure 1E:
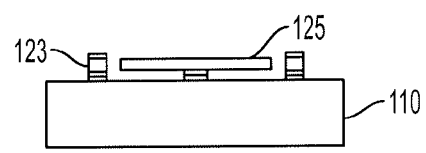
FIG. 1E is a diagram of a processing step according to an implementation of the present disclosure.

In FIG. 1E, a MEMS device 125 is fabricated from the device wafer 120. The device wafer 120 may be etched or otherwise processed to form the MEMS device 125. For example, if the MEMS device 125 is a MEMS gyroscope, such as a Si disc resonator gyroscope (DRG), the device wafer 120 is accordingly patterned. The MEMS device 125 may have free floating portions with a center portion of the MEMS device 125 being connected to the base wafer 110, as shown in FIG. 1E. In other implementations, depending on the type of device fabricated, the MEMS device 125 may be connected to the base wafer 110 at other portions, and may not have free floating portions.

Also as seen in FIG. 1E, a bonding column 123 is formed. The bonding column 123 may be formed by etching or otherwise removing portions of the device wafer 120 surrounding the cap bonding pads 122. The bonding column 123 may be formed from the aligned base bonding pad 111, the device bonding pad 121, the remaining portion of the device wafer 120, and the cap bonding pad 122. The bonding column 123 extends higher than the MEMS device 125, which helps ensure sufficient space around the MEMS device 125. Although the side view presented by FIG. 1E illustrates two bonding columns 123, the bonding column 123 may form a continuous structure which encircles or otherwise surrounds the MEMS device 125. This would advantageously allow a cap to completely seal the MEMS device 125 in a vacuum enclosure. In other implementations, a plurality of bonding columns 123 may discretely surround the MEMS device 125.

Figure 1F:
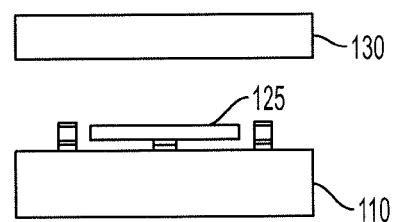
FIG. 1F is a diagram of a processing step according to an implementation of the present disclosure.
Figure 1G:
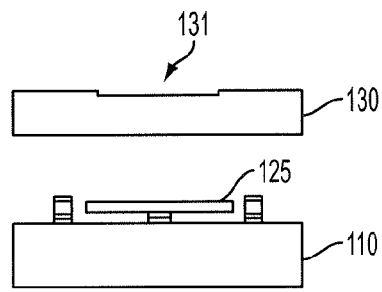
FIG. 1G is a diagram of a processing step according to an implementation of the present disclosure.

In FIG. 1F, a cap wafer 130 is provided. The cap wafer 130 may be made of a suitable material, such as Si, at a sufficient thickness. At FIG. 1G, a recess 131 is formed. The recess 131 may be formed by etching or other suitable process. Although FIG. 1G shows a simplified side view of the recess 131, the recess 131 may be patterned to remove portions of the cap wafer 130 as needed. For example, the recess 131 may comprise trenches that correspond to trace layouts. In other implementations, the recess 131 may be an area on the top surface of the cap wafer 130. The recess 131 extends below the top surface of the cap wafer 130 to provide room for circuitry incorporated into the cap wafer 130. This allows the circuitry, such as a trace circuit 140 in FIG. 1H, to sit below the surface of the cap wafer 130 in order to reduce the likelihood of damage during subsequent processing.

Figure 1J:
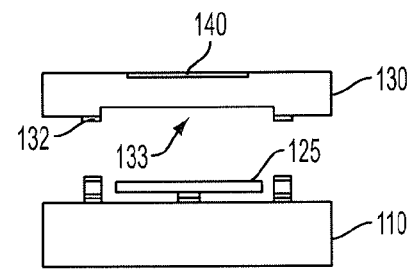
FIG. 1J is a diagram of a processing step according to an implementation of the present disclosure.
Figure 1H:
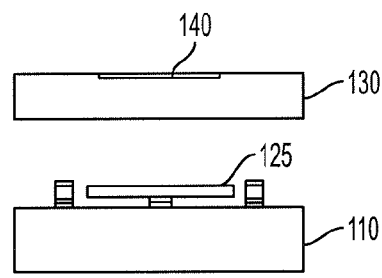
FIG. 1H is a diagram of a processing step according to an implementation of the present disclosure.

In FIG. 1H, the trace circuit 140 is formed in the recess 131. The trace circuit 140 may be material that is patterned and etched or formed by another suitable process. For example, metal may be deposited into the recess 131 by evaporation. Photolithography may shape the metal. With photolithography, the metal is deposited into the trenches and patterned using masking methods with photoresist. In FIG. 1H, the trace circuit 140 fills the recess 131, although in other implementations, the trace circuit 140 may occupy portions of the recess 131. The trace circuit 140 may be a heater and a sensor, as will be described further below.

Figure 1K:
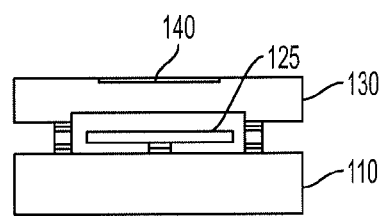
FIG. 1K is a diagram of a processing step according to an implementation of the present disclosure.
Figure 1I:
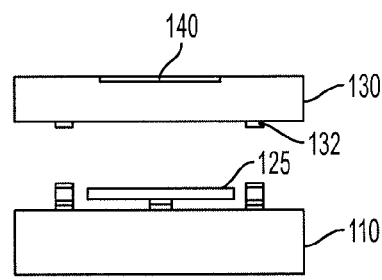
FIG. 1I is a diagram of a processing step according to an implementation of the present disclosure.

In FIG. 1I, the cap bonding pads 132 are formed. The cap bonding pads 132 may be formed by first turning over the cap wafer 130, so that the trace circuit 140 faces downwards. Then the cap bonding pads 132 may be patterned and etched onto the cap wafer 130 without affecting the trace circuit 140. The cap bonding pads 132 may be made of material similar to or compatible with the cap bonding pads 122. In FIG. 1J, a cap recess 133 is formed. The cap recess 133 may be formed by etching the cap wafer 130 after the cap bonding pads 132 are formed, with the trace circuit 140 facing down. The cap recess 133 ensures there is adequate space around the MEMS device 125. For example, the MEMS device 125 may be a MEMS gyroscope which vibrates in free space. The cap recess 133 provides space for the MEMS device 125 to vibrate without interference. In FIG. 1K, the cap wafer 130 is connected to the base wafer 110. The cap wafer 130 may be bonded to the base wafer 110 through a thermo-compression bond, similar to FIG. 1C, or bonded in another suitable process. Having the trace circuit 140 disposed within the recess 131 allows bonding without damaging the trace circuit 140.

Figure 1L:
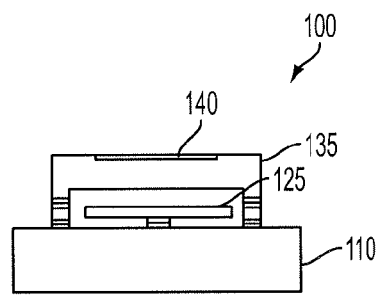
FIG. 1L is a diagram of a processing step according to an implementation of the present disclosure.

In FIG. 1L, a cap 135 is formed. The cap 135 may be formed by etching the cap wafer 130 to desired dimensions. A device package 100, comprising the cap 135, the MEMS device 125, and the base wafer 110 may be further processed. For example, the base wafer 110 may be etched or otherwise cut to desired dimensions, which may include cutting the base wafer 110 out of a larger wafer. The device package 100 may be further treated, for example by oxidizing the surfaces of the device package 100. Oxidizing helps avoid any traces from shorting. Thermal oxidization provides insulation. The cap 135 may vacuum seal the MEMS device 125.

Figure 2A:
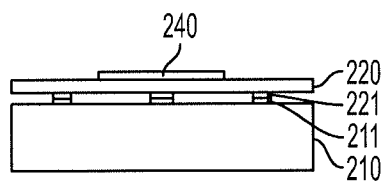
FIG. 2A is a diagram of a processing step according to another implementation of the present disclosure.
Figure 2B:
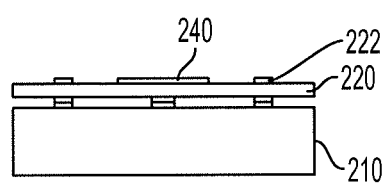
FIG. 2B is a diagram of a processing step according to another implementation of the present disclosure.

FIGS. 2A-2H show another implementation of the present disclosure. FIG. 2A illustrates an alternative processing step after the step illustrated in FIG. 1C. In FIG. 2A, a base wafer 210 corresponds to the base wafer 110, a base bonding pads 211 correspond to the base bonding pads 111, device bonding pads 221 correspond to the device bonding pads 121, and a device wafer 220 corresponds to the device wafer 120. In FIG. 2A, a trace circuit 240, which may correspond to the trace circuit 140, is formed on the device wafer 220, rather than the cap wafer 130. In FIG. 2B, cap bonding pads 222, which correspond to the cap bonding pads 122, are formed on the device wafer 220. The trace circuit 240 and the cap bonding pads 222 may be fabricated through a patterning/etching process or other suitable method. For example, the trace circuit 240 may be deposited and patterned through photolithography. Although FIGS. 2A and 2B show the trace circuit 240 being formed first, the trace circuit 240 and the cap bonding pads 222 may be formed simultaneously, or the cap bonding pads 222 may be formed first.

Figure 2C:
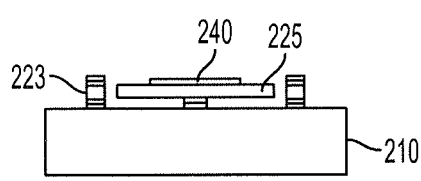
FIG. 2C is a diagram of a processing step according to another implementation of the present disclosure.

In FIG. 2C, a MEMS device 225 is formed. The device wafer 220 may be etched or otherwise processed to form the MEMS device 225. The MEMS device 225 may correspond to the MEMS device 125, and may further be a MEMS gyroscope, such as a DRG. In addition, a bonding column 223, which corresponds to the bonding column 123, is formed. The bonding column 223 may encircle the MEMS device 225. In other implementations, the trace circuit 240 may be patterned after the MEMS device 225 is etched.

Figure 2D:
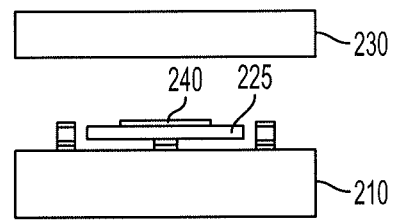
FIG. 2D is a diagram of a processing step according to another implementation of the present disclosure.
Figure 2E:
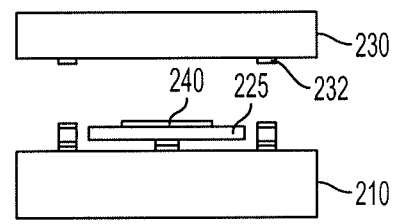
FIG. 2E is a diagram of a processing step according to another implementation of the present disclosure.
Figure 2F:
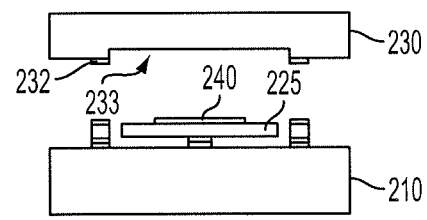
FIG. 2F is a diagram of a processing step according to another implementation of the present disclosure.

In FIG. 2D, a cap wafer 230, which corresponds to the cap wafer 130, is provided. In FIG. 2E, cap bonding pads 232, which corresponds to the cap bonding pads 132, are formed on the underside of the cap wafer 230. The cap bonding pads 232 may be formed from a suitable patterning process. In FIG. 2F, a cap recess 233, which corresponds to the cap recess 133, is formed from, for example, etching. The cap recess 233 may be configured to allow extra clearance for the trace circuit 240 disposed on top of the MEMS device 225.

Figure 2G:
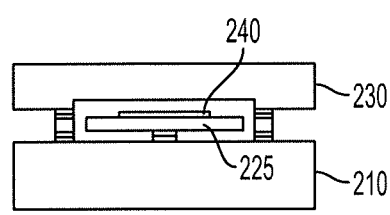
FIG. 2G is a diagram of a processing step according to another implementation of the present disclosure.
Figure 2I:
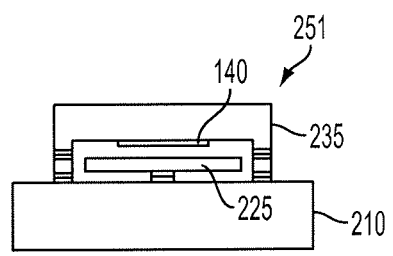
FIG. 2I is a diagram of another configuration according to an implementation of the present disclosure.
Figure 2H:
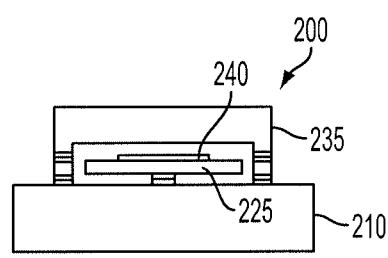
FIG. 2H is a diagram of a processing step according to another implementation of the present disclosure.

In FIG. 2G, the cap wafer 230 is attached to the base wafer 210. The cap bonding pads 232 is bonded to the bonding column 223 through a thermo-compression bond or other suitable bonding process. In FIG. 2H, the cap wafer 230 is etched to form a cap 235. A device package 200 may undergo further processing, such as cutting the base wafer 210 and oxidizing surfaces.

Figure 2J:
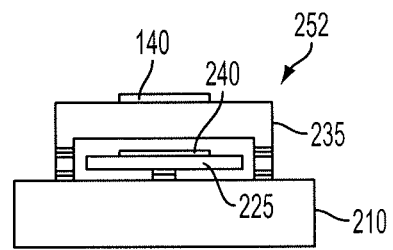
FIG. 2J is a diagram of another configuration according to another implementation of the present disclosure.

FIG. 1L shows the device package 100 having the trace circuit 140 disposed on the main outer surface of the cap 135. FIG. 2H shows the device package 200 having the trace circuit 240 disposed on the MEMS device 225 itself. FIG. 2I shows another implementation of the present disclosure. A device package 251 comprises the cap 235, the MEMS device 225, the trace circuit 140 and the base wafer 210. However, the trace circuit 140 is disposed on an inner surface of the cap 235. FIG. 2J shows yet another implementation. A device package 252 comprises the cap 235, the MEMS device 225, the trace circuit 140, the trace circuit 240, and the base wafer 210. The trace circuit 140 is disposed on the top or main outer surface of the cap 235 and the trace circuit 240 is disposed on the MEMS device 225. In this implementation, the trace circuit 140 may not correspond to the trace circuit 240.

Figure 3A:
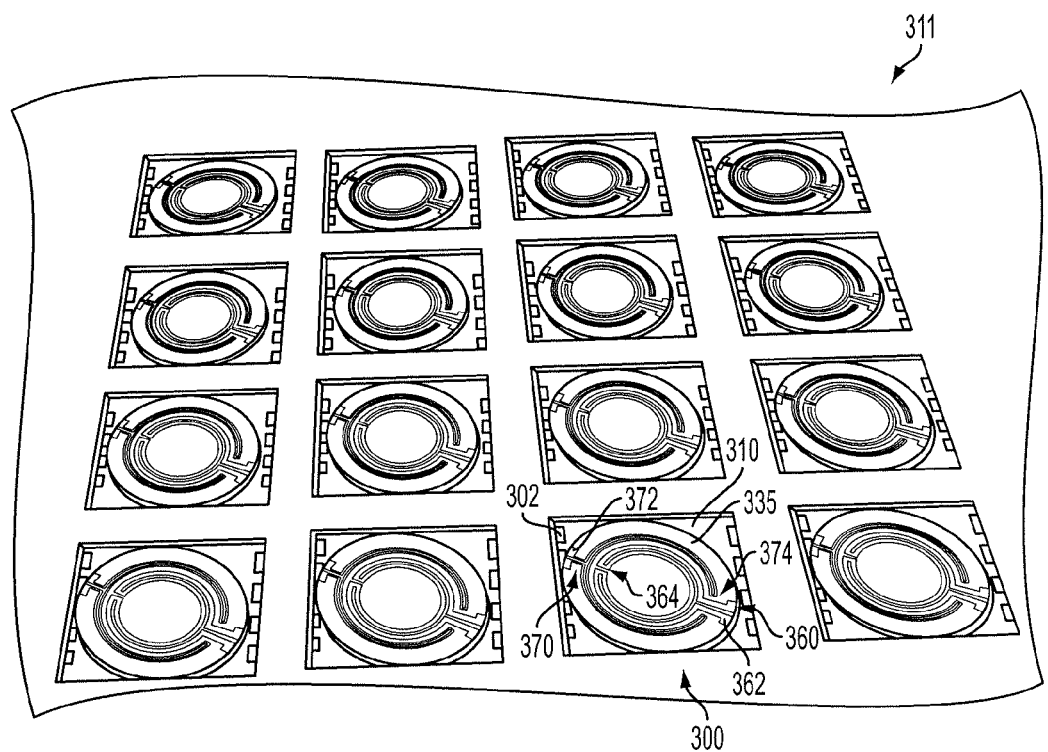
FIG. 3A is a wafer of devices according to an implementation of the present disclosure.
Figure 3B:
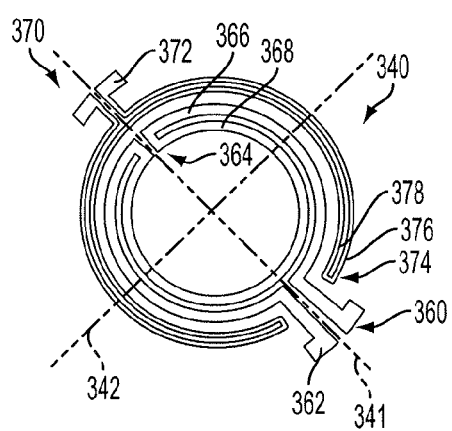
FIG. 3B is a top view of a cap of FIG. 3A according to an implementation of the present disclosure.
Figure 3C:
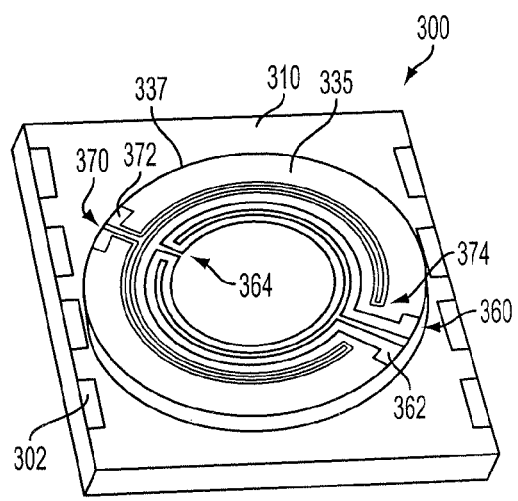
FIG. 3C is a single device cut from the wafer in FIG. 3A according to an implementation of the present disclosure.

FIG. 3A illustrates a wafer 311 including a plurality of MEMS device packages 300. The MEMS device packages 300 have not been diced out or removed from the wafer 311. As seen in FIG. 3C, each MEMS device package 300, which corresponds to the device package 100, includes a cap 335 corresponding to the cap 135 and a base 310 corresponding to the base wafer 110, which encompass a MEMS device, not visible. The base 310 includes a plurality of contact pads 302 for electrical connection, such as through wire bonding. The cap 335 is circular, although it may take other shapes in other implementations. The cap 335 includes a trace circuit 340, shown in FIG. 3B. The trace circuit 340 includes two devices in FIG. 3B, a heater 360 and a temperature sensor 370.

The heater 360 may be a resistive metal trace, such as Platinum (Pt) or Nickel-Chromium (NiCr). The geometry and thickness of the material for the heater 360 is chosen based on desired electrical characteristics. The heater 360 has a double-loop geometry to minimize perturbations in magnetic field introduced by the current flow through the conductor. As seen in FIG. 3B, a loop 364 comprises a first portion 366 which extends and loops back to a second portion 368, which follows alongside the first portion 366. The second portion 368 is offset from the first portion 366 but mirrors or follows along the first portion 366. The magnetic field introduced by the current flow through the first portion 366 is generally cancelled or countered by the magnetic field from the current flow through the second portion 368. Without the loops, the electromagnetic fields generated from the current flow through the heater 360 may interfere with nearby circuits and components.

The heater 360 has two loops 364, allowing for a more symmetrical design. However, if magnetic field sensitivity is not an issue, then the loops 364 may not be needed. In addition, the heater 360 is generally symmetrical about a first axis 341. The heater 360 terminates at two pads 362 for electrical connection. The pads 362 are near an outer edge 337 of the cap 335.

The temperature sensor 370 generally surrounds the heater 360. The temperature sensor 370 is a resistance temperature detector (RTD) made of a material, such as Pt, with a predetermined temperature coefficient of resistance. Temperature is measured by correlating the resistance of the temperature sensor 370 to temperature. The geometry of the temperature sensor 370 is also selected to minimize electromagnetic interference. Similar to the heater 360, the temperature sensor 370 has a double-loop geometry. A loop 274 comprises a first portion 376 which extends and loops back to a second portion 378, which follows alongside the first portion 376. The temperature sensor 370 has two loops 374, allowing for a more symmetrical design. However, if magnetic field sensitivity is not an issue, then the loops 374 may not be needed. The temperature sensor 370 is generally symmetrical about the first axis 341. The temperature sensor 370 terminates at two pads 372 for electrical connection. The temperature sensor 370 also generally mirrors the heater 360 about a second axis 342, which may be perpendicular to the first axis 341. This layout allows the pads 362 to be disposed opposite the pads 372.

Figure 3D:
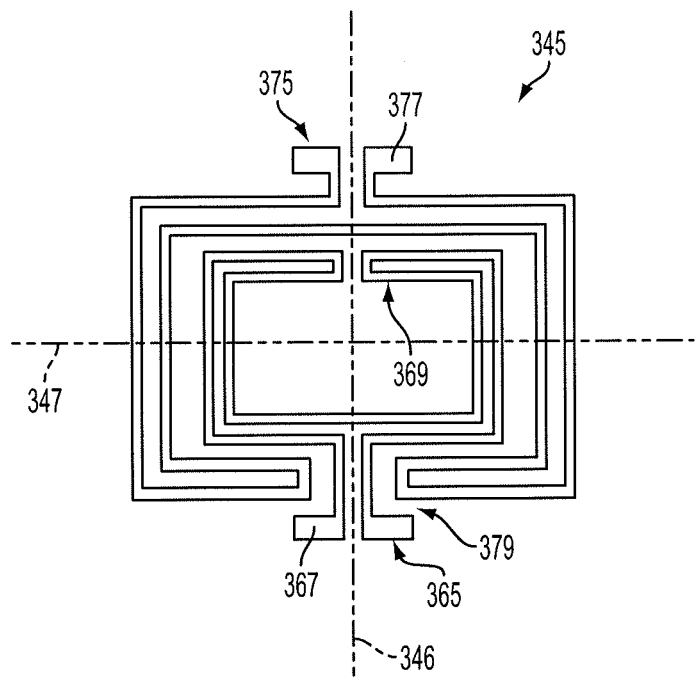
FIG. 3D is a top view of a cap according to an implementation of the present disclosure.
Figure 3E:
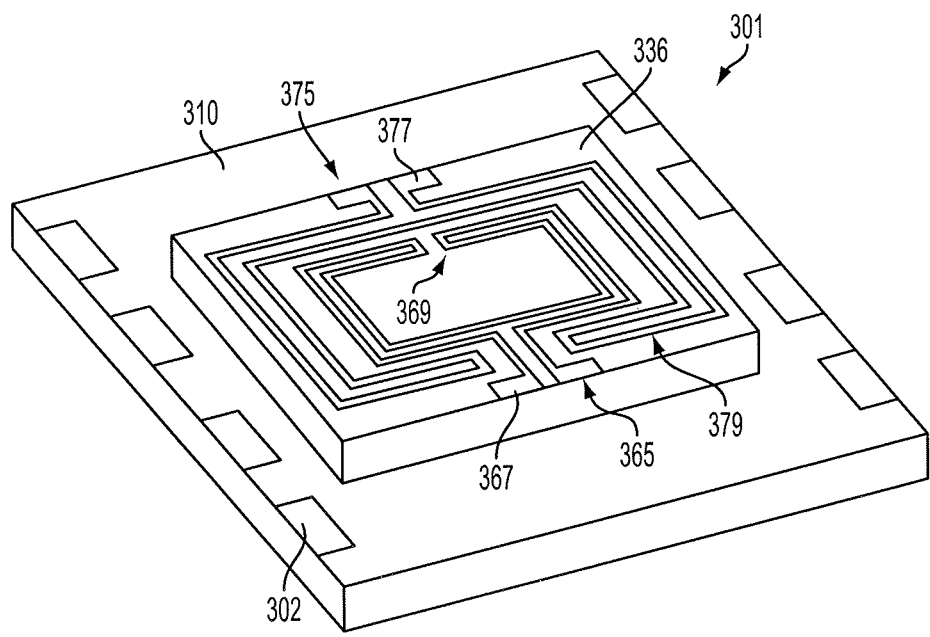
FIG. 3E is a single device having the cap of FIG. 3D according to an implementation of the present disclosure.

Although the FIGS. 3A-3C show a circular layout for a circular cap, other configurations may be used. FIGS. 3D and 3E show a square layout. A circuit 345 has a square layout, which is generally symmetrical about a first axis 346, and mirrored about a second axis 347. Similar to the heater 360, a heater 365 includes two loops 369 in a double-loop configuration, and terminates at two pads 367. Similar to the temperature sensor 370, a temperature sensor 375 includes two loops 379 in a double-loop configuration, and terminates at two pads 377.

A MEMS device package 301 is similar to the MEMS device package 300. The MEMS device package 301 includes the base 310 and a cap 336, which encompass a MEMS device, not shown. The cap 336 is square shaped and includes the heater 365 and the temperature sensor 375.

Closed-loop control algorithms stabilize the temperature of the heater in order to prevent temperature variation of the MEMS device during operation. The temperature may be set at a bias temperature that is higher than the highest expected temperature the MEMS device would normally experience. For example, if 30 degrees Celsius is the highest expected temperature, then the bias temperature may be between 40-50 degrees Celsius. Alternatively, the bias temperature may be set with a 5 or 10 degrees Celsius offset, or other appropriate offset above the highest expected temperature.

The bias temperature ensures that a MEMS gyroscope does not experience temperatures higher than the bias temperature, in order to maintain a stable temperature and vibration frequency. The stable temperature reduces temperature drift effects and other errors, resulting in a more accurate response. For example, as you average out sensor values over longer periods of time, the response should become more accurate if there is just average noise. With a drift component to the error, there is a point at which averaging over a longer period of time does not produce more precise results. However, temperature regulation with the cap reduces the drift effect, which allows integrating over a longer period of time. Temperature regulation prevents the vibration frequency of the MEMS gyroscope from drifting.

Because the heater and the temperature sensor are on the cap, they do not physically contact the MEMS device. The cap may be made of heat conductive material, such as Si. Heating and detecting the temperature of the MEMS device may exhibit a slight delay due to the conduction through the cap. To reduce the delay, the heater and temperature sensor may be placed directly on the MEMS device. The need for this added performance may outweigh the additional cost that may be needed to fabricate the heater and the temperature sensor onto the MEMS device.

FIGS. 4A and 4B depict an implementation having the heater and the temperature sensor on the MEMS device, as in FIG. 2H. In FIG. 4A, a MEMS gyroscope 425, which may be a DRG, comprises a plurality of beams 424 connected to nodes 422. The MEMS gyroscope 425 also comprises a center stem portion 426, which may extend down to connect to a base (not shown). The center stem portion 426 is circular, but may be another shape in other implementations.

FIG. 4B shows a zoomed in view of the center stem portion 426. A heater 460 includes two loops 464 and terminates at two pads 462. A temperature sensor 470 includes two loops 474 and terminates at two pads 472. The heater 460 and the temperature sensor 470 are generally symmetrical about a first axis 441. The heater 460 generally mirrors the temperature sensor 470 about a second axis 442. However, unlike the heater 360 and the temperature sensor 370, the heater 460 and the temperature sensor 470 terminate near a center of the center stem portion 426, rather than its outer edge. This configuration allows for easier connection without interfering with the beams 424 and the nodes 422.

Figure 5:
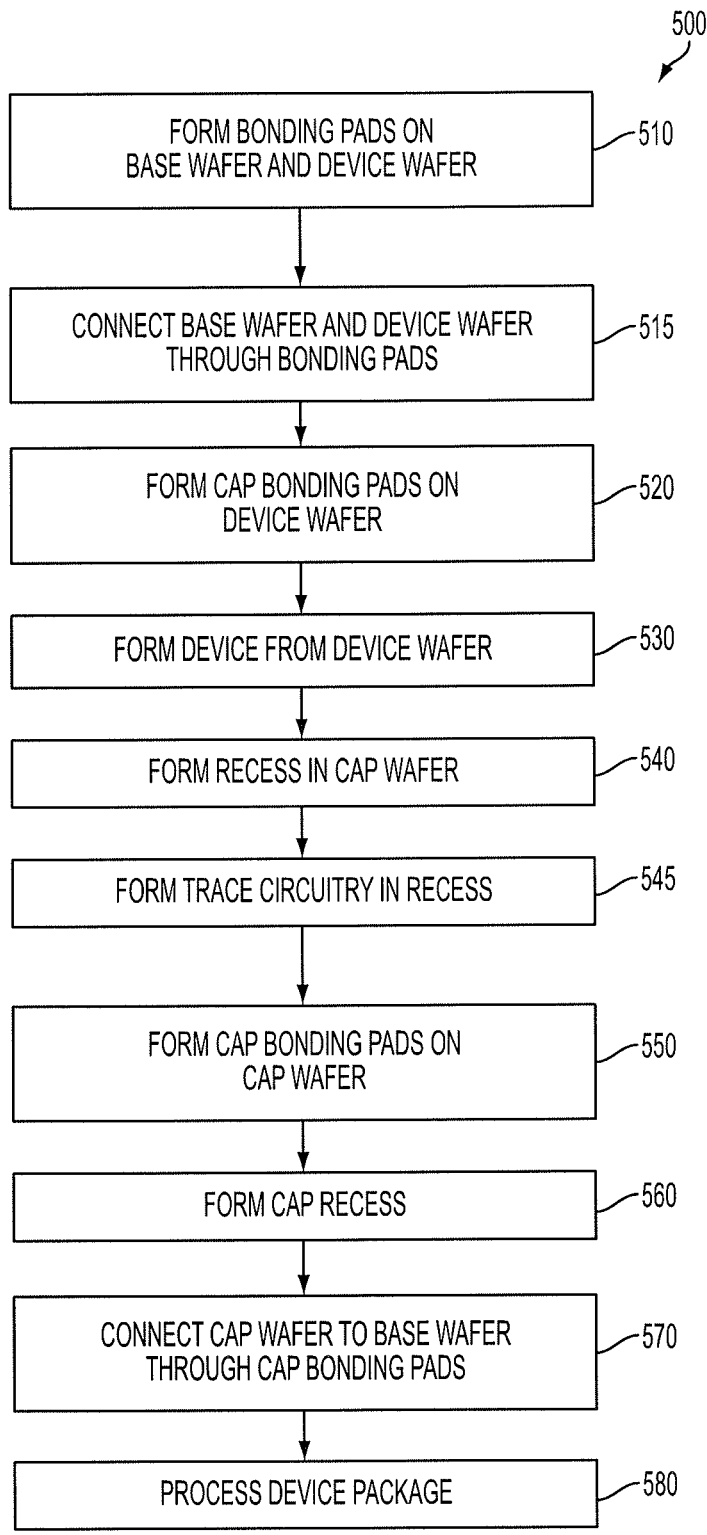
FIG. 5 is a flowchart of a fabrication process according to an implementation of the present disclosure.

FIG. 5 shows a flowchart 500 of a fabrication process according to an implementation of the present disclosure. The flowchart 500 corresponds to FIGS. 1A-1L. At 510, bonding pads, such as the base bonding pads 111 and the device bonding pads 121 in FIG. 1B, are formed on a base wafer, such as the base wafer 110, and a device wafer, such as the device wafer 120. At 515, the base wafer and device wafer are connected through the bonding pads, such as in FIG. 1C. Thermo-compression bonds may be used. At 520, cap bonding pads, such as the cap bonding pads 122 in FIG. 1D, are formed on the device wafer.

At 530, a device is formed from the device wafer. The device may be a MEMS device, such as the MEMS device 125 in FIG. 1E, which may be formed by etching the device wafer. At 540, a recess is formed in a cap wafer, such as the recess 131 in the cap wafer 130 in FIG. 1G. The recess may be specifically patterned trenches that correspond to conductive traces or other circuitry, or may be a recessed portion of the top surface of the cap wafer. At 545, trace circuitry is formed in the recess, such as the trace circuit 140 in FIG. 1H. The trace circuitry may be a heater and a sensor, or other circuits as needed in a particular application, and formed through evaporation and photolithography. In addition, other electrical connections, such as connections between various layers, may be made as needed.

At 550, cap bonding pads are formed on the cap wafer, such as cap bonding pads 132 in FIG. 1I. At 560, a cap recess is formed, such as the cap recess 133 in FIG. 1J. At 570, the cap wafer is connected to the base wafer through the cap bonding pads, such as seen in FIG. 1K. At 580, a device package, such as the device package 100 in FIG. 1L, is processed. The device package may be processed by further etching the base wafer, or other processing such as oxidizing the surfaces of the package device.

Figure 6:
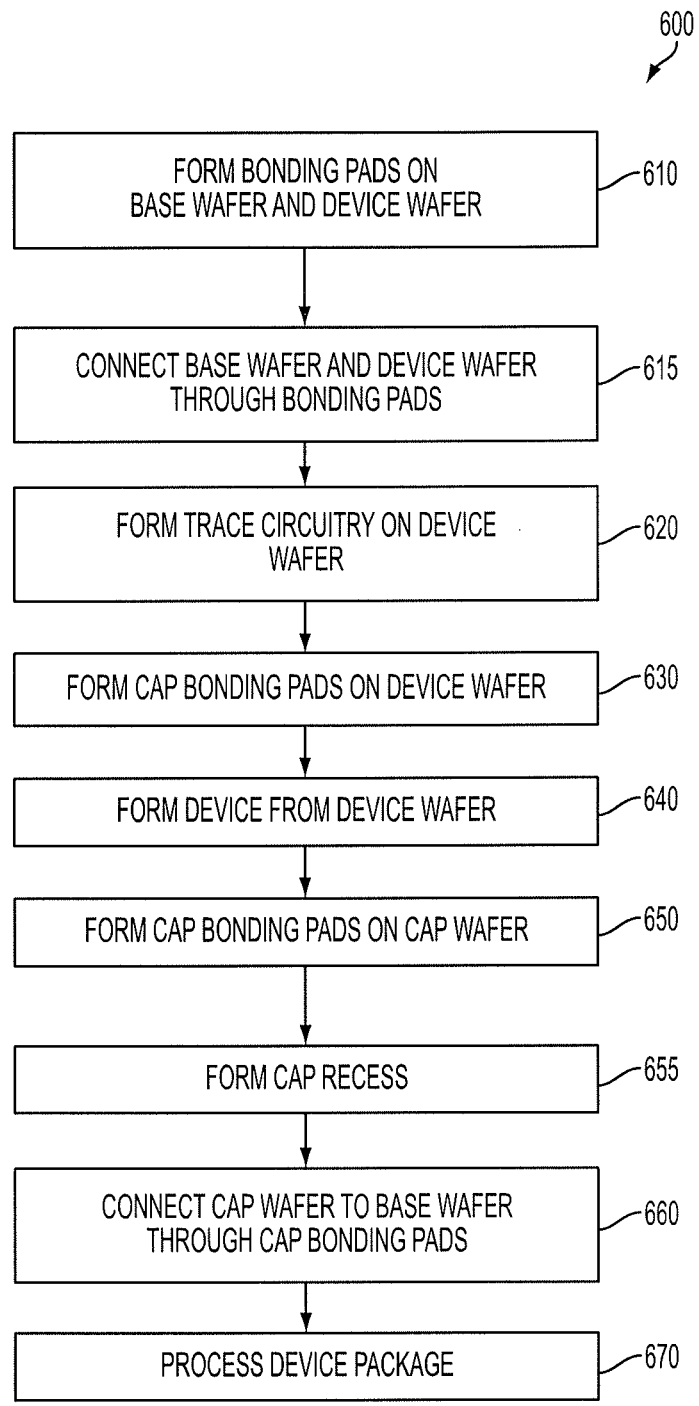
FIG. 6 is a flowchart of a fabrication process according to another implementation of the present disclosure.

FIG. 6 shows a flowchart 600 of a fabrication process according to another implementation of the present disclosure. The flowchart 600 corresponds to FIGS. 1A-1C and 2A-2H. At 610, bonding pads, such as the base bonding pads 111 and the device bonding pads 121 in FIG. 1B, are formed on a base wafer, such as the base wafer 110, and a device wafer, such as the device wafer 120. At 615, the base wafer and device wafer are connected through the bonding pads, such as in FIG. 1C. Thermo-compression bonds may be used. At 620, trace circuitry is formed on the device wafer, such as the trace circuit 240 in FIG. 2A. The trace circuitry may be a heater and a sensor, or other circuits as needed in a particular application, and formed through evaporation and photolithography. At 630, cap bonding pads, such as the cap bonding pads 222 in FIG. 2B, are formed on the device wafer.

At 640, a device is formed from the device wafer. The device may be a MEMS device, such as the MEMS device 225 in FIG. 2C, and formed by etching the device wafer. In addition, other electrical connections, such as connections between various layers, may be made as needed. At 650, cap bonding pads are formed on the cap wafer, such as cap bonding pads 232 in FIG. 2E. At 655, a cap recess is formed, such as the cap recess 233 in FIG. 2F. At 660, the cap wafer is connected to the base wafer through the cap bonding pads, such as seen in FIG. 2G. At 670, a device package, such as the device package 200 in FIG. 2H, is processed. The device package may be processed by further etching the base wafer, or other processing such as oxidizing the surfaces of the package device.

Exemplary implementations of the disclosure have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such implementations that reasonably fall within the scope of the advancement to the art hereby contributed, and that that scope shall not be restricted, except in light of the appended claims and their equivalents.

What is claimed is:

1. A cap that encloses a MEMS device comprising:
  a body having an inner surface that covers the MEMS device and an outer surface that is exposed outward from the MEMS device;
  a first pad located on the outer surface;
  a second pad located on the outer surface; and
  a trace circuit embedded in the outer surface, the trace circuit having a first trace connected to the first pad and a second trace connected to the second pad.

2. The cap of claim 1, wherein the trace circuit has a first trench and a second trench, wherein the first trace is located within the first trench and the second trace is located within the second trench.

3. The cap of claim 1, wherein the first trace includes a temperature sensor and the second trace includes a heater.

4. The cap of claim 1, wherein the first trace includes a first portion and a second portion, the second portion looping back to extend alongside the first portion and wherein the second trace includes a first portion and a second portion, the second portion looping back to extend alongside the first portion.

5. The cap of claim 1, wherein the first pad is positioned opposite the second pad.

6. The cap of claim 1, wherein the first trace is positioned on a periphery of the outer surface and the second trace is generally surrounded by the first trace.

7. The cap of claim 1, wherein the first trace is generally symmetrical about a central axis of the cap and the second trace is generally symmetrical about the central axis of the cap.

8. The cap of claim 1, wherein the first trace generally mirrors the second trace about a central axis of the cap.

9. A MEMS device package comprising:
  a base layer;
  a MEMS device connected to the base layer;
  a cap having an inner surface surrounding the MEMS device and an outer surface that is exposed outward from the MEMS device, the cap connected to the base layer to encapsulate the MEMS device;
  a first trench in the cap;
  a second trench in the cap;
  a first pad on the cap;
  a second pad on the cap;
  a trace circuit embedded in the outer surface, the trace circuit having a first trace located in the first trench and connected to the first pad and a second trace located in the second trench and connected to the second pad.

10. The MEMS device package of claim 9, wherein the cap forms a vacuum enclosure around the MEMS device.

11. The MEMS device package of claim 9, wherein, the first and second trenches are located along the outer surface, and the first pad and the second pad are located on the outer surface.

12. The MEMS device package of claim 9, wherein the first trace comprises a temperature sensor and the second trace comprises a heater.

13. The MEMS device package of claim 9, wherein the MEMS device comprises a gyroscope.

14. The MEMS device package of claim 9, wherein the MEMS device comprises a disc resonator gyroscope (DRG).

15. A MEMS device package comprising:
  a base layer;
  a MEMS device having a central stem portion connected to the base layer and one or more traces on the central stem portion of the MEMS device;
  a cap that encloses the MEMS device and connected to the base layer to encapsulate the MEMS device;
  a first pad on the central stem portion;
  a second pad on the central stem portion;
  a first trace of the one or more traces on the central stem portion of the MEMS device and connected to the first pad; and
  a second trace of the one or more traces on the central stem portion of the MEMS device and connected to the second pad.

16. The MEMS device package of claim 15, wherein the cap forms a vacuum enclosure around the MEMS device.

17. The MEMS device package of claim 15, wherein the first trace comprises a temperature sensor and the second trace comprises a heater.

18. The MEMS device package of claim 15, wherein the MEMS device comprises a gyroscope.

19. The MEMS device package of claim 15, wherein the MEMS device comprises a disc resonator gyroscope (DRG).

* * * * *